United States Patent
Kitamura

(10) Patent No.: US 10,084,420 B2
(45) Date of Patent: Sep. 25, 2018

(54) MULTISTAGE AMPLIFIER

(71) Applicant: PANASONIC CORPORATION, Osaka (JP)

(72) Inventor: Ryo Kitamura, Kanagawa (JP)

(73) Assignee: PANASONIC CORPORATION, Osaka (JP)

(*) Notice: Subject to any disclaimer, the term of this patent is extended or adjusted under 35 U.S.C. 154(b) by 0 days.

(21) Appl. No.: 14/765,851

(22) PCT Filed: Dec. 25, 2013

(86) PCT No.: PCT/JP2013/007600
§ 371 (c)(1),
(2) Date: Aug. 5, 2015

(87) PCT Pub. No.: WO2014/122715
PCT Pub. Date: Aug. 14, 2014

(65) Prior Publication Data
US 2015/0372652 A1    Dec. 24, 2015

(30) Foreign Application Priority Data

Feb. 7, 2013  (JP) .................................. 2013-022562

(51) Int. Cl.
*H03F 3/45*  (2006.01)
*H03F 1/42*  (2006.01)
(Continued)

(52) U.S. Cl.
CPC ........... *H03F 3/45179* (2013.01); *H03F 1/42* (2013.01); *H03F 3/193* (2013.01); *H03F 3/195* (2013.01);
(Continued)

(58) Field of Classification Search
CPC ...... H03F 3/45179; H03F 3/193; H03F 3/195; H03F 3/45183; H03F 3/45475; H03F 1/42; H03G 1/0035
(Continued)

(56) References Cited

U.S. PATENT DOCUMENTS 6,127,890 A * 10/2000 Shimomura ......... H03G 1/0023
330/134
6,930,549 B2 * 8/2005 Kajiwara ............. H03G 3/3042
330/133

(Continued)

FOREIGN PATENT DOCUMENTS

| CN | 1461519 A | 12/2003 |
|---|---|---|
| CN | 1485981 A | 3/2004 |

(Continued)

OTHER PUBLICATIONS

International Search Report for Application No. PCT/JP2013/007600 dated Mar. 25, 2014.
(Continued)

*Primary Examiner* — Khanh V Nguyen
*Assistant Examiner* — Khiem Nguyen
(74) *Attorney, Agent, or Firm* — Pearne & Gordon LLP

(57) ABSTRACT

Provided is a multistage amplifier that can achieve both utilizing in a broad bandwidth and suppressing gain reduction. The multistage amplifier includes a plurality of differential amplifiers which are connected in series; and a direct-current component limiter that cuts off a direct-current component of input signals, in which the direct-current component limiter is disposed between the plurality of differential amplifiers, and in which a transistor size of a first differential amplifier which is disposed immediately after the direct-current component limiter is equal to or greater than a transistor size of a second differential amplifier which (Continued)

is disposed two stages before the direct-current component limiter.

11 Claims, 19 Drawing Sheets

(51) Int. Cl.
*H03F 3/193* (2006.01)
*H03F 3/195* (2006.01)
*H03G 1/00* (2006.01)
*H03G 3/30* (2006.01)

(52) U.S. Cl.
CPC ..... *H03F 3/45183* (2013.01); *H03F 3/45475* (2013.01); *H03G 1/0035* (2013.01); *H03F 2200/336* (2013.01); *H03F 2200/405* (2013.01); *H03F 2203/45038* (2013.01); *H03F 2203/45051* (2013.01); *H03F 2203/45212* (2013.01); *H03F 2203/45352* (2013.01); *H03F 2203/45591* (2013.01); *H03F 2203/45594* (2013.01); *H03F 2203/45601* (2013.01); *H03F 2203/45702* (2013.01); *H03G 3/3036* (2013.01)

(58) Field of Classification Search
USPC .................. 330/253, 254, 258, 310
See application file for complete search history.

(56) References Cited

U.S. PATENT DOCUMENTS

| | | | |
|---|---|---|---|
| 7,049,895 B2* | 5/2006 | Miyagi | .............. H03F 3/16 330/310 |
| 2004/0066233 A1 | 4/2004 | Miyagi | |
| 2004/0070447 A1 | 4/2004 | Miyagi | |
| 2005/0118976 A1 | 6/2005 | Murakami et al. | |
| 2005/0233714 A1 | 10/2005 | Kajiwara et al. | |
| 2005/0237116 A1 | 10/2005 | Miyagi | |
| 2006/0284671 A1 | 12/2006 | Ohba | |
| 2012/0098606 A1* | 4/2012 | Yagasaki | ............... H03F 1/3211 331/74 |
| 2012/0262235 A1 | 10/2012 | Hoogzaad | |

FOREIGN PATENT DOCUMENTS

| | | |
|---|---|---|
| CN | 102739172 A | 10/2012 |
| JP | 8-125504 A | 5/1996 |
| JP | 10-284956 A | 10/1998 |
| JP | 2004-336706 A | 11/2004 |
| JP | 2006-352401 A | 12/2006 |
| JP | 2007-312001 A | 11/2007 |
| JP | 2011-055055 A | 3/2011 |

OTHER PUBLICATIONS

Eduard Säckinger, et al. "A 3-GHz 32-dB CMOS Limiting Amplifier for SONET OC-48 Receivers", IEEE Journal of Solid-State Circuits, vol. 35, No. 12, pp. 1884-1888, Dec. 2000.

* cited by examiner

MULTISTAGE AMPLIFIER

TECHNICAL FIELD

The present disclosure relates to a multistage amplifier and, for example, a multistage amplifier that amplifies signals in wireless communication.

BACKGROUND ART

A differential amplifier has an advantage of removing common mode noise as compared to other type of amplifier, and is widely used for amplifying baseband signals of a communication device (for example, a mobile phone or a communication terminal conform to a wireless local area network (LAN)).

As the differential amplifier in the related art, a multistage amplifier is known in which differential amplifiers are connected in multiple stages, and Inverse Scaling is applied (for example, see NPL 1). In the Inverse Scaling of NPL 1, a circuit is designed in such a manner that a transistor size of the differential amplifier of each stage is reduced by half in order toward the subsequent stage.

Further, a multistage amplifier is known in which differential amplifiers are connected in multiple stages and a DC offset of the differential amplifier of each stage is corrected by calibration (for example, see PTL 1).

CITATION LIST

Patent Literature

[PTL 1] JP-A-2011-055055 Non Patent Literature
[NPL 1] Eduard Sackinger and Wilhelm C. Fischer, "A 3-GHz 32-dB CMOS Limiting Amplifier for SONET OC-48 Receivers", IEEEJOURNAL OF SOLID-STATE CIRCUITS, DECEMBER 2000, vol. 35, NO. 12. P 1884-P 1888.

SUMMARY OF INVENTION

Technical Problem

In NPL 1 and PTL 1, when the multistage amplifier is utilized in a broad bandwidth, a gain of the multistage amplifier is reduced.

The present disclosure is made in view of the above circumstance, and provides a multistage amplifier that can achieve both utilizing in a broad bandwidth and suppressing gain reduction.

Solution to Problem

A multistage amplifier according to the present disclosure includes a plurality of differential amplifiers which are connected in series; and a direct-current component limiter that cuts off a direct-current component of input signals, in which the direct-current component limiter is disposed between the plurality of differential amplifiers, and in which a transistor size of a first differential amplifier which is disposed immediately after the direct-current component limiter is equal to or greater than a transistor size of a second differential amplifier which is disposed two stages before the direct-current component limiter.

Advantageous Effects of Invention

According to the present disclosure, it is possible to achieve both utilizing in a broad bandwidth and suppressing gain reduction.

DESCRIPTION OF EMBODIMENTS

Hereinafter, embodiments of the present disclosure will be described with reference to the drawings.

(Background for Achieving an Aspect of the Present Disclosure)

For example, a short-range wireless system of a millimeter wave band conforming to IEEE802.11 processes baseband signals of broadband (for example, 880 MHz bandwidth) (hereinafter, simply, referred to as "broadband signals"). Therefore, a system handling broadband signals requires a broadband differential amplifier, as compared to, for example, a differential amplifier handling baseband signals of a communication device in the related art.

Figure 16:
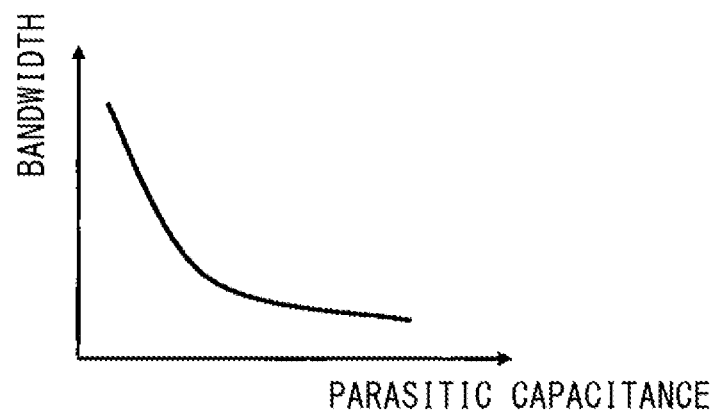
FIG. 16 is a schematic diagram illustrating an example of a relationship between a bandwidth and a parasitic capacitance of the differential amplifier.

FIG. 16 is a schematic diagram illustrating a relationship between a bandwidth of signals that can be processed by a differential amplifier and a parasitic capacitance of a transistor that the differential amplifier includes. Generally, as the parasitic capacitance of the transistor is increased, the bandwidth is reduced. Therefore, in order to realize broad bandwidth in the differential amplifier, it is necessary to reduce the parasitic capacitance of the transistor. Since the parasitic capacitance of the transistor is proportional to the transistor size, it is necessary to reduce the transistor size in order to reduce the parasitic capacitance.

Figure 17:
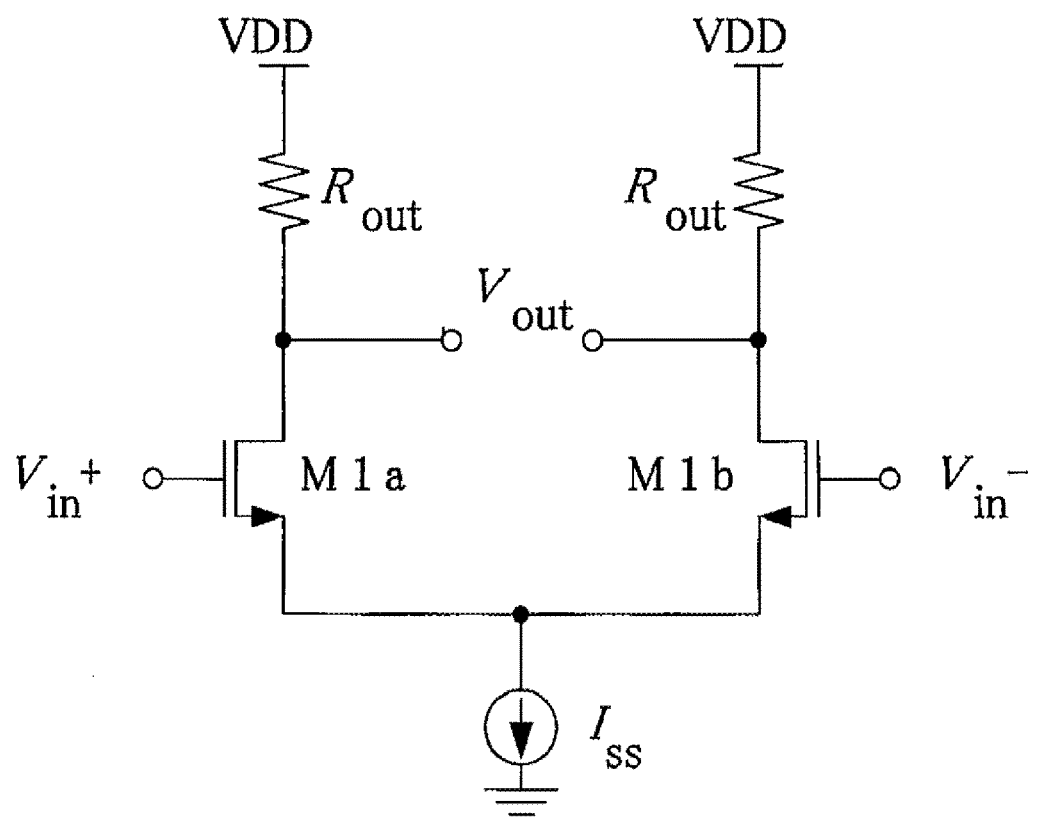
FIG. 17 is a circuit diagram illustrating a circuit configuration example of a transistor level of the differential amplifier.

Meanwhile, when the transistor size is reduced, the mismatch of characteristics (for example, a threshold voltage) of a transistor pair (for example, input terminals M1$a$ and M1$b$ in FIG. 17) to which signals of the differential amplifier are inputted is increased. In this case, a variation of a difference of DC voltages (hereinafter, referred to as a DC offset) on the positive side and the negative side of a differential signal input to the differential amplifier is increased. FIG. 17 is a circuit diagram illustrating a circuit configuration example of the differential amplifier.

Figure 18:
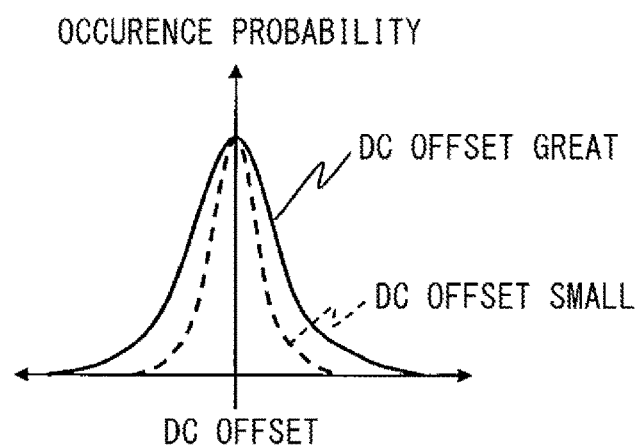
FIG. 18 is a schematic diagram illustrating an example of a relationship between a DC offset and a probability of occurrence of the DC offset.

When a plurality of transistors having same characteristics are tried to be manufactured, a variation occurs in the characteristics (for example, a DC offset) of the transistor according to, for example, a normal distribution. FIG. 18 is a schematic diagram illustrating a relationship between a DC offset and the probability of occurrence of each DC offset.

Figure 19:
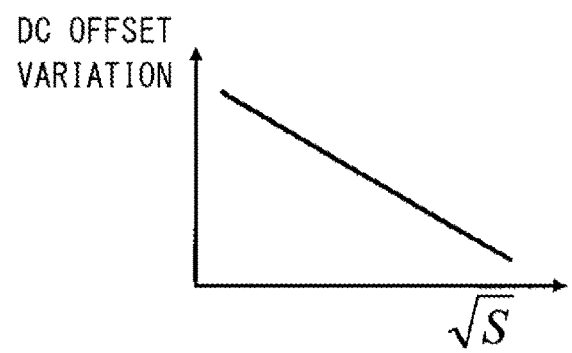
FIG. 19 is a schematic diagram illustrating an example of a variation of the DC offset for a transistor size.

The variation of the threshold voltage of the transistor is generally inversely proportional to the square root of the transistor size S. The variation of the DC offset of the differential amplifier is generally proportional to the variation amount of the threshold voltage of the transistor. Therefore, the variation of the DC offset of the differential amplifier is inversely proportional to the square root of the transistor size S, as illustrated in FIG. 19.

Figure 20:
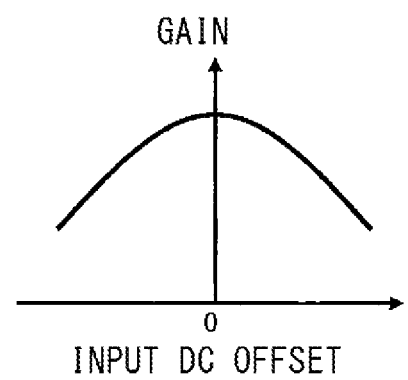
FIG. 20 is a schematic diagram illustrating an example of a gain characteristic of a differential amplifier with respect to the DC offset which is inputted to the differential amplifier.

Further, as illustrated in FIG. 20, as the absolute value of the DC offset of the differential amplifier is increased, the gain of the differential amplifier is reduced; and as the absolute value of the DC offset is reduced, the gain of the differential amplifier is increased. Therefore, when the variation of the DC offset of the differential amplifier is increased, the gain of the differential amplifier varies, and the gain is reduced.

In this manner, there is a trade-off relationship between the expansion of the bandwidth of the differential amplifier, the variation reduction of the DC offset, and the gain reduction.

Next, technologies based on NPL 1 and PTL 1 are considered.

Figure 21:
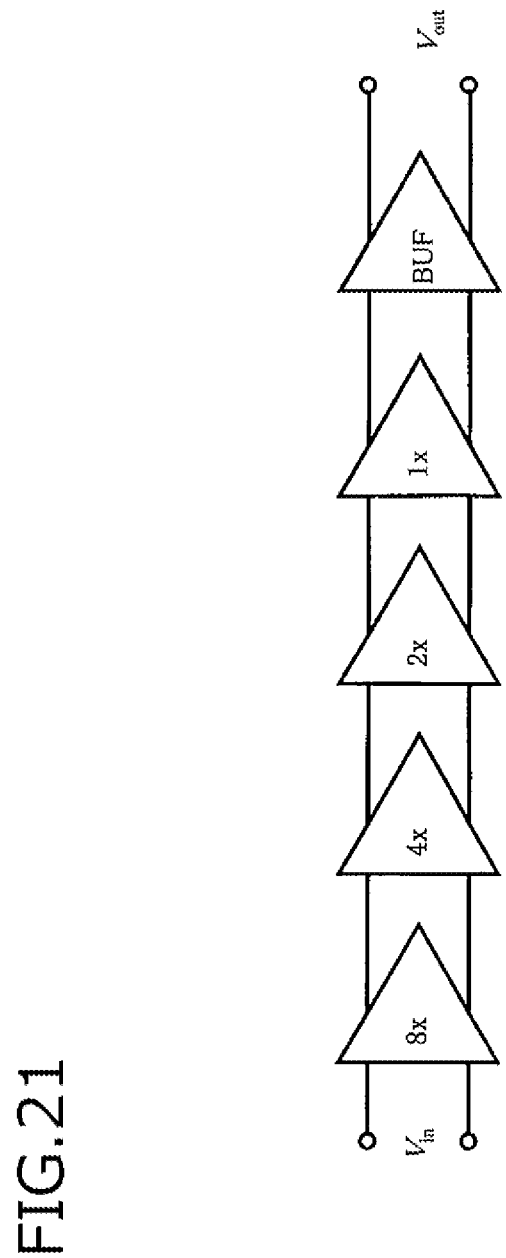
FIG. 21 is a circuit diagram illustrating a configuration of a multistage amplifier of NPL 1 to which Inverse Scaling is applied.

FIG. 21 is a circuit diagram illustrating a configuration of the multistage amplifier of NPL 1 to which Inverse Scaling is applied.

In FIG. 21, a transistor size of a differential amplifier of a first stage is "8x", a transistor size of a differential amplifier of a second stage is "4x", a transistor size of a differential amplifier of a third stage is "2x", and a transistor size of a differential amplifier of a fourth stage is "1x". "x" indicates a predetermined value.

In the multistage amplifier, the parasitic capacitance of the transistor of the differential amplifier of a subsequent stage more greatly contributes to an output of the multistage amplifier than the parasitic capacitance of the transistor of the differential amplifier of a preceding stage. When Inverse Scaling is applied, the transistor size is reduced toward the subsequent stage, and thus the broadband can be further expanded as compared to a case of equally configuring the transistor size of the preceding differential amplifier.

Further, the DC offset generated by the differential amplifier and an alternating current component are amplified by the differential amplifier of each stage. Therefore, an influence of the DC offset generated in the differential amplifier close to an input terminal of the multistage amplifier is greater than the influence of the DC offset generated in the differential amplifier close to an output terminal of the multistage amplifier.

In the Inverse Scaling, the closer to the input terminal of the multistage amplifier, the larger the transistor size of the transistor included in the differential amplifier. Therefore, the closer to the input terminal, the smaller the variation of the DC offset generated in the differential amplifier, and the smaller the variation of the DC offset input to the last differential amplifier of the multistage amplifier.

However, when the Inverse Scaling of NPL 1 is applied to a short-range wireless system that performs communication in a radio frequency bandwidth including a millimeter wave band (for example, a frequency band conforming to IEEE802.11ad), it is necessary to consider the following circumstances.

In the recent communication system, the number of systems handling broadband signals has increased further. For example, as compared to a communication device handling a baseband bandwidth of about 20 MHz in the related art, a communication device performing millimeter wave communication handles a baseband bandwidth of about 880 MHz, such that the baseband bandwidth is 40 times or more. Therefore, since it is necessary to further reduce the parasitic capacitance to satisfy the bandwidth and to further reduce the transistor size of the differential amplifier of each stage, the variation reduction of DC offset becomes difficult. Therefore, it is difficult to achieve both of the broad bandwidth and the gain reduction.

Further, when the broadband signals are amplified, a gain per one stage of the differential amplifier is reduced, and thus the differential amplifiers of more stages than in the related art are connected, in order to realize a reception sensitivity defined by the standard as the receiver. In this case, when the Inverse Scaling is performed by implementing the broad bandwidth, the transistor size of the differential amplifier close to the output terminal of the multistage amplifier is reduced. Accordingly, in the differential amplifier close to the output terminal of the multistage amplifier, a large variation of the DC offset is generated and input to the differential amplifier of the last stage. Therefore, a variation occurs in the gain of the multistage amplifier, and the gain may be reduced.

In PTL 1, it is not possible to follow the variation in the DC offset after the calibration (for example, the variation due to temperature change), and the gain may also be reduced.

Hereinafter, a description will be made regarding a multistage amplifier that can achieve both utilizing in the broad bandwidth and suppressing gain reduction.

The multistage amplifier in the following embodiment is mounted in a wireless device conforming to the specification of Wireless Fidelity (WiFi) and Wireless Gigabit (WIGIG). Further, the multistage amplifier processes broad frequency signals (for example, bandwidth 100 MHz or more).

First Embodiment

Figure 1:
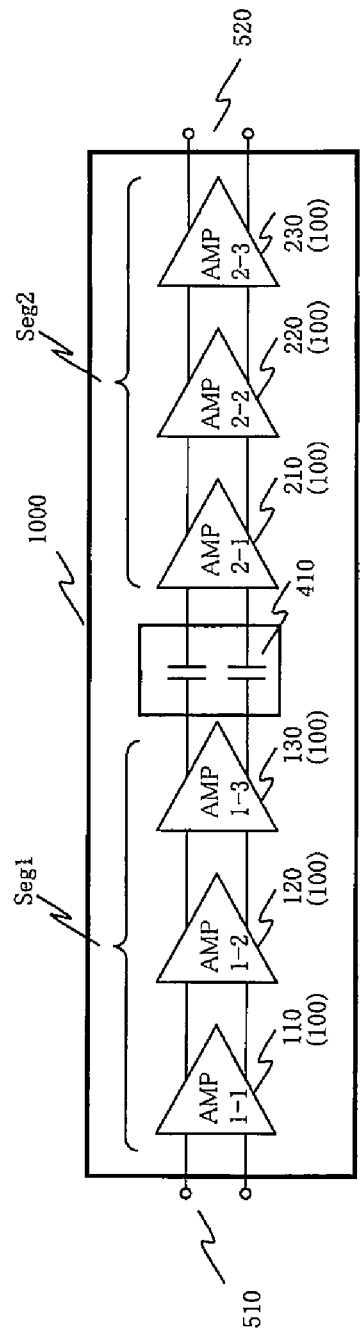
FIG. 1 is a circuit diagram illustrating a circuit configuration example of a multistage amplifier in a first embodiment.

FIG. 1 is a circuit diagram illustrating a circuit configuration example of a multistage amplifier 1000 in a first embodiment. The multistage amplifier 1000 includes an input terminal 510 and an output terminal 520. Further, the multistage amplifier 1000 includes a differential amplifier 110 of the (1-1)-th stage, a differential amplifier 120 of the (1-2)-th stage, and a differential amplifier 130 of the (1-3)-th stage. Further, the multistage amplifier 1000 includes a differential amplifier 210 of the (2-1)-th stage, a differential amplifier 220 of the (2-2)-th stage, and a differential amplifier 230 of the (2-3)-th stage. Further, the multistage amplifier 1000 includes a high pass filter (HPF) 410. FIG. 1 is an example of a multistage amplifier of six stages.

When the respective differential amplifiers (for example, the differential amplifiers 110, 120, 130, 210, 220, and 230) are not distinguished particularly, they are simply referred to as "differential amplifier 100".

In the multistage amplifier 1000, a plurality of differential amplifiers 100 are connected in series. The differential amplifiers 100 included in the multistage amplifier 1000 are disposed while being divided into segments depending on the input terminal, the output terminal of the multistage amplifier 1000, or the HPF. Further, a first segment Seg1, a second segment Seg2, are arranged in this order from the input terminal to the output terminal of the multistage amplifier 1000. In FIG. 1, a range from the input terminal 510 of the multistage amplifier 1000 to the HPF 410 is the first segment, and a range from the HPF 410 to the output terminal 520 of the multistage amplifier 1000 is the second segment.

One or more differential amplifiers are included in each segment. When a plurality of differential amplifiers are included in a segment, the differential amplifier of the first stage, the differential amplifier of the second stage, . . . are arranged in this order from the input terminal to the output terminal of the multistage amplifier 1000.

The differential amplifier of "the (X-Y)-th stage" represents a differential amplifier of the Y-th stage in the X-th segment.

Differential baseband signals which are inputted from the input terminal 510 are outputted to the HPF 410 through the differential amplifier 110 of the (1-1)-th stage, the differential amplifier 120 of the (1-2)-th stage, and the differential amplifier 130 of the (1-3)-th stage. Further, the differential baseband signals which are outputted from the HPF 410 is outputted from the output terminal 520 through the differential amplifier 210 of the (2-1)-th stage, a differential amplifier 220 of the (2-2)-th stage, and a differential amplifier 230 of the (2-3)-th stage.

Each differential amplifier 100 is, for example, similarly configured, and the circuit thereof is configured, for example, as illustrated in FIG. 17. Input signals Vin+ that are inputted to the differential amplifier 100 is a positive phase side of the differential baseband signals, and input signals Vin− are a reverse phase side of the differential baseband signals.

The HPF 410 cuts off a direct-current component contained in signals that are inputted to the HPF 410. For example, the HPF 410 cuts off (cancels) the DC offset that is generated by each differential amplifier in the segment of the preceding stage and input to the HPF 410. The HPF 410 is an example of a direct-current component limiter.

The HPF 410 may have a function of giving DC bias voltage (VDD) to the differential amplifier 210 of the (2-1)-th stage.

Figure 2:
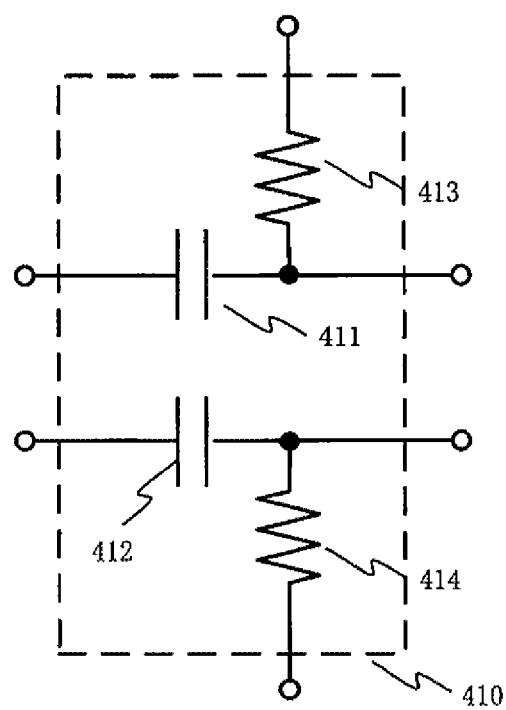
FIG. 2 is a circuit diagram illustrating a configuration example of a high pass filter (HPF) that is included in the multistage amplifier in the first embodiment.

FIG. 2 is a circuit diagram illustrating a circuit configuration example of the HPF 410. The HPF 410 includes, for example, capacitors 411 and 412, and coils 413 and 414. Since the HPF 410 is included, it is possible to cancel the DC offset occurring in each differential amplifier 100 in the first segment Seg1 which is the preceding stage, by a simple configuration. Therefore, it is possible to reduce the influence of the DC offset to the differential amplifier 230 of the (2-3)-th stage which is the differential amplifier of the last stage in the second segment Seg2 and is closest to the output terminal of the multistage amplifier 1000.

Therefore, when performing the Inverse Scaling for each segment in the multistage amplifier 1000, it is possible to suppress the DC offset that is inputted to the differential amplifier of the last stage in each segment. Therefore, it is possible to avoid a situation where the transistor included in the differential amplifier of the last stage in each segment does not operate in a desired operating area, and retain a desired gain.

Next, a description will be made regarding a setting example of the transistor size S of the transistor included in the differential amplifier 100.

In the present embodiment, the transistor size S is represented by, for example, the following equation based on the gate width of at least the transistor.

$S = L \times W$, or $S = W$

Here, L: gate length of a transistor, and W: gate width of a transistor.

When the transistor size S of the differential amplifier 100 of the (X-Y)-th stage is set to $S_{X-Y}$, the transistor size is designed to satisfy the following equations (1), in the multistage amplifier 1000.

$S_{1-1} \geq S_{1-2}$ $S_{2-1} \geq S_{2-2}$ $S_{2-1} \geq S_{1-2}$              Equations (1)

Figure 3:
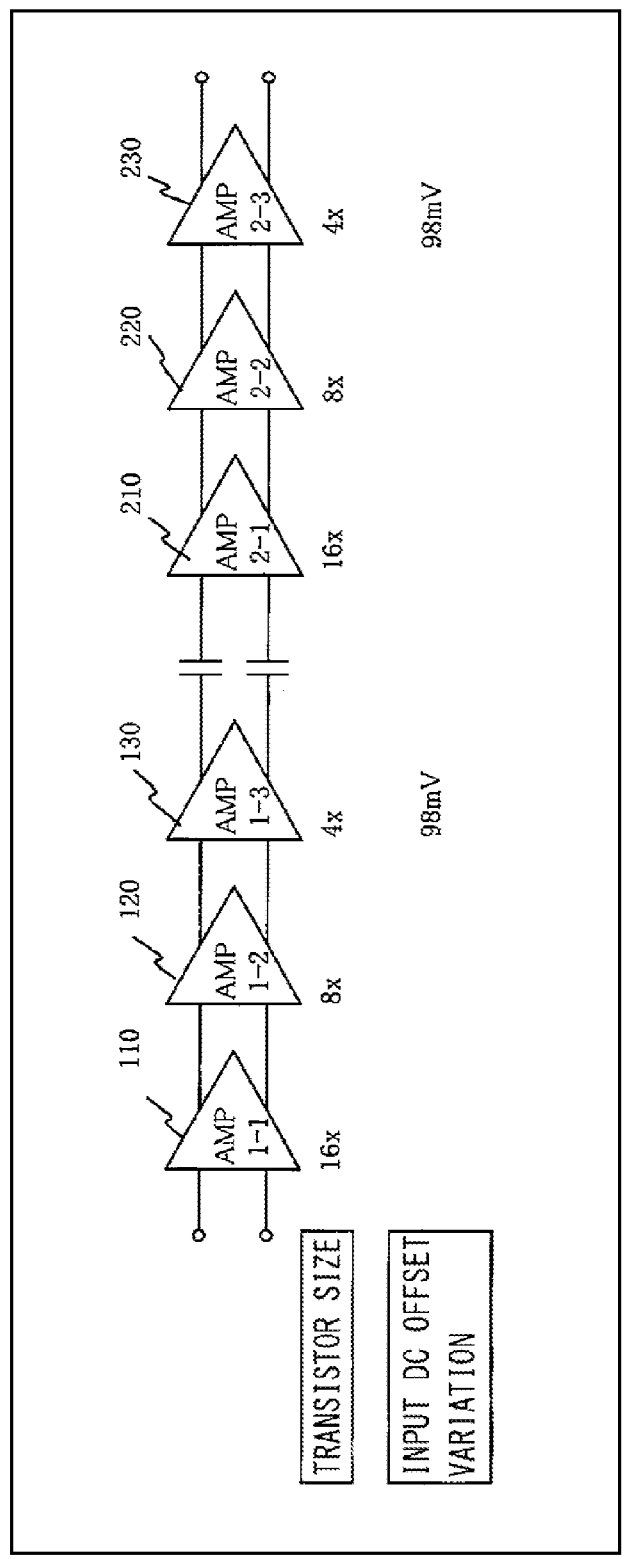
FIG. 3 is a schematic diagram illustrating examples of a transistor size and a variation of a direct current (DC) offset of the multistage amplifier in the first embodiment.

In other words, in each segment, the transistor size of the differential amplifier 100 is designed by the Inverse Scaling (see FIG. 3). For example, the transistor size of the differential amplifier 110 of the (1-1)-th stage is assumed as "16x". "x" indicates a predetermined value. Similarly, for example, the transistor size of the differential amplifier 120 of the (1-2)-th stage is assumed as "8x", and the transistor size of the differential amplifier 130 of the (1-3)-th stage is assumed as "4x". Further, for example, the transistor size of the differential amplifier 210 of the (2-1)-th stage is assumed as "16x", the transistor size of the differential amplifier 220 of the (2-2)-th stage is assumed as "8x", and the transistor size of the differential amplifier 230 of the (2-3)-th stage is assumed as "4x".

By setting $S_{1-1} \geq S_{1-2}$, the variation of the DC offset generated in the differential amplifier 110 of the (1-1)-th stage is reduced more than the variation of the DC offset generated in the differential amplifier 120 of the (1-2)-th stage having a relatively small influence. Since the DC offset of the differential amplifier 110 of the (1-1)-th stage is also amplified even in the differential amplifier 120 to which signals are relayed, the influence to the variation of the DC offset that is inputted to the differential amplifier 130 of the (1-3)-th stage is greater than the differential amplifier 120 of the (1-2)-th stage.

Therefore, since the transistor size of the differential amplifier 100 in each stage gradually decreases in the first segment Seg1, it is possible to suppress an increase in the transistor size and an increase in the parasitic capacitance. Further, it is possible to efficiently reduce the DC offset that is inputted to the differential amplifier 130 of the (1-3)-th stage.

Similarly, since the transistor size of the differential amplifier 100 in each stage gradually decreases in the second segment Seg2 by setting $S_{2-1} \geq S_{2-2}$, it is possible to suppress an increase in the transistor size and an increase in the parasitic capacitance. Further, it is possible to efficiently reduce the DC offset that is inputted to the differential amplifier 230 of the (2-3)-th stage.

Further, the transistor sizes of the differential amplifiers 210 and 220 of the subsequent stages can be designed to be greater than the HPF 410 which has been designed to be significantly small in a case of applying the Inverse Scaling in the related art, by setting $S_{2-1} \geq S_{1-2}$. Thus, it is possible to reduce the variation of the DC offset that is inputted to the differential amplifier 230 of the (2-3)-th stage.

In addition, the condition of $S_{1-2} \geq S_{1-3}$ may be satisfied or not satisfied. In other words, the transistor size of any one (here, the differential amplifier 110) of differential amplifiers from the first stage to two stages before the last stage in the segment may be equal to or greater than the transistor size of the differential amplifier (here, the differential amplifier 120) disposed immediately after the differential amplifier. Further, the transistor size of the differential amplifier (here, differential amplifier 120) which is the second stage from the last stage in the segment may not be equal to or greater than the transistor size of the differential amplifier (here, differential amplifier 130) disposed immediately after the differential amplifier. Even in this case, the DC offset that is outputted from the differential amplifier 130 of the last stage can be cut off by the HPF 410 disposed immediately after the differential amplifier 130, and the influence of the DC offset to the subsequent segment can be suppressed.

In addition, the differential amplifier 210 of the (2-1)-th stage is an example of the first differential amplifier that is disposed immediately after the direct-current component limiter. The differential amplifier 120 of the (1-2)-th stage is an example of the second differential amplifier that is disposed two stages before the direct-current component limiter.

In this manner, since it is possible to reduce the variation of the DC offsets that are inputted to the differential amplifiers 130 and 230 of the last stages in the respective segments, it is possible to suppress a decrease in the gain of the multistage amplifier 1000.

Next, a description will be made regarding the transistor size and the variation of the DC offsets of the multistage amplifiers of the present embodiment and in the related art.

Figure 4:
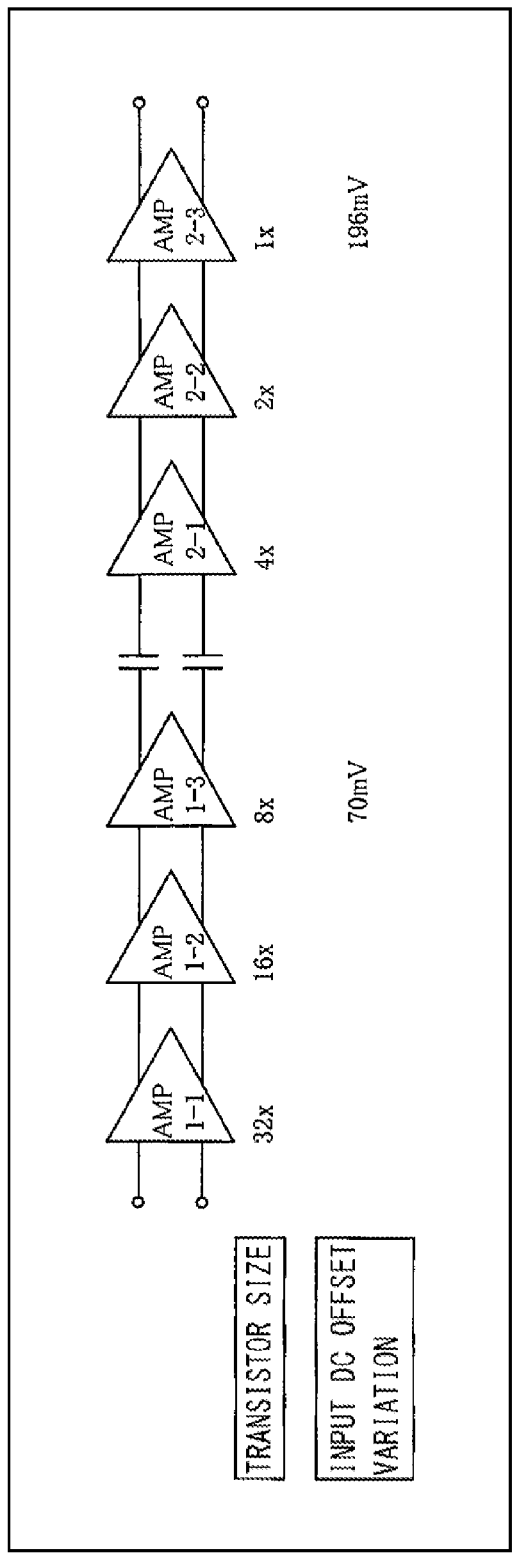
FIG. 4 is a schematic diagram illustrating examples of a transistor size and a variation of a DC offset of a multistage amplifier of the related art when a circuit is configured similar to the multistage amplifier in the first embodiment.

FIG. 3 is a schematic diagram illustrating an example of the transistor size S and the variation of the DC offset of the multistage amplifier 1000 of the present embodiment. FIG. 4 is a schematic diagram illustrating an example of the transistor size S and the variation of the DC offset of a multistage amplifier obtained by inserting the HPF into the multistage amplifier in the related art, similar to the multistage amplifier 1000. FIGS. 3 and 4 are diagrams illustrating examples of simulation results.

Here, the transistor sizes are set in such a manner that the bandwidths in consideration of the parasitic capacitances of the transistors in each differential amplifier are the same in the present embodiment and the related art. Further, the parasitic capacitance of the drain terminal of the transistor per one transistor in each differential amplifier is assumed as 0.7 fF, and the parasitic capacitance of the gate terminal is assumed as 1.4 fF.

In the multistage amplifier 1000 of FIG. 3, in each segment, the transistor size of the differential amplifier 100 is designed by the Inverse Scaling. In the multistage amplifier of FIG. 4, the transistor size of the differential amplifier, from the input terminal to the output terminal of the multistage amplifier, is designed by the Inverse Scaling.

For example, in FIG. 4, the transistor size of the differential amplifier of the (1-1)-th stage is assumed as "32x", the transistor size of the differential amplifier of the (1-2)-th stage is assumed as "16x", and the transistor size of the differential amplifier of the (1-3)-th stage is assumed as "8x". Further, the transistor size of the differential amplifier of the (2-1)-th stage is assumed as "4x", the transistor size of the differential amplifier of the (2-2)-th stage is assumed as "2x", and the transistor size of the differential amplifier of the (2-3)-th stage is assumed as "1x".

In the simulation, the input of the differential amplifier of the last stage in each segment (for example, the differential amplifier of the (1-3)-th stage, and the differential amplifier of the (2-3)-th stage) is performed using a test device which is not illustrated. The test device measures, for example, the DC offset characteristics of a plurality of samples (integrated circuits (IC) of a plurality of multistage amplifiers 100). Then, the test device derives a difference between a maximum value (for example, +3σ value) and a minimum value (for example, −3σ value) of the DC offset of each measured result, as the variation of the DC offset.

The variations of the DC offsets are compared. The variation of the DC offset that is inputted to the differential amplifier of the (1-3)-th stage is 98 mV in the present embodiment, and 70 mV in the related art method. Therefore, it is possible to understand that the variation of the DC offset in the present embodiment is slightly larger than in the related art.

The variation of the DC offset that is inputted to the differential amplifier of the (2-3)-th stage is 98 mV in the present embodiment, and 196 mV in the related art method. Therefore, it is possible to understand that the variation of the DC offset in the present embodiment is significantly smaller than in the related art, and is reduced by about half.

According to the multistage amplifier 1000, it is possible to suppress a gain variation due to a variation of the DC offset of each differential amplifier 100. Thus, for example, it is possible to reduce a margin of each differential amplifier 100 at a time of design, and power consumption.

Further, for example, an increase in the number of stages of the differential amplifier 100 is expected in a short-range wireless system using a radio frequency band including a millimeter wave band, but the variation of the DC offset in each segment can be reset according to the multistage amplifier 1000. Therefore, even when the number of stages of the differential amplifier 100 is increased, the variation of the DC offset is not increased, and it is possible to achieve both broad bandwidth and gain reduction suppression. The short-range wireless system described above is a system using, for example, IEEE802.11ad.

Further, in order to suppress the DC offset, it is possible to assume that the direct-current component is cut off by the HPF in each differential amplifier 100, but in this case, the number of circuit elements is increased, and thus it is difficult to miniaturize the multistage amplifier. According to the multistage amplifier 1000, miniaturization of the circuit scale can be realized.

Further, since the HPF is inserted into the multistage amplifier 4000 in the right place, the DC offset can be cut off at a proper time, and the DC offset can be prevented from being excessively increased. Therefore, the inputs to the differential amplifier of the last stage can be prevented from being saturated.

(Modification 1)

Figure 5:
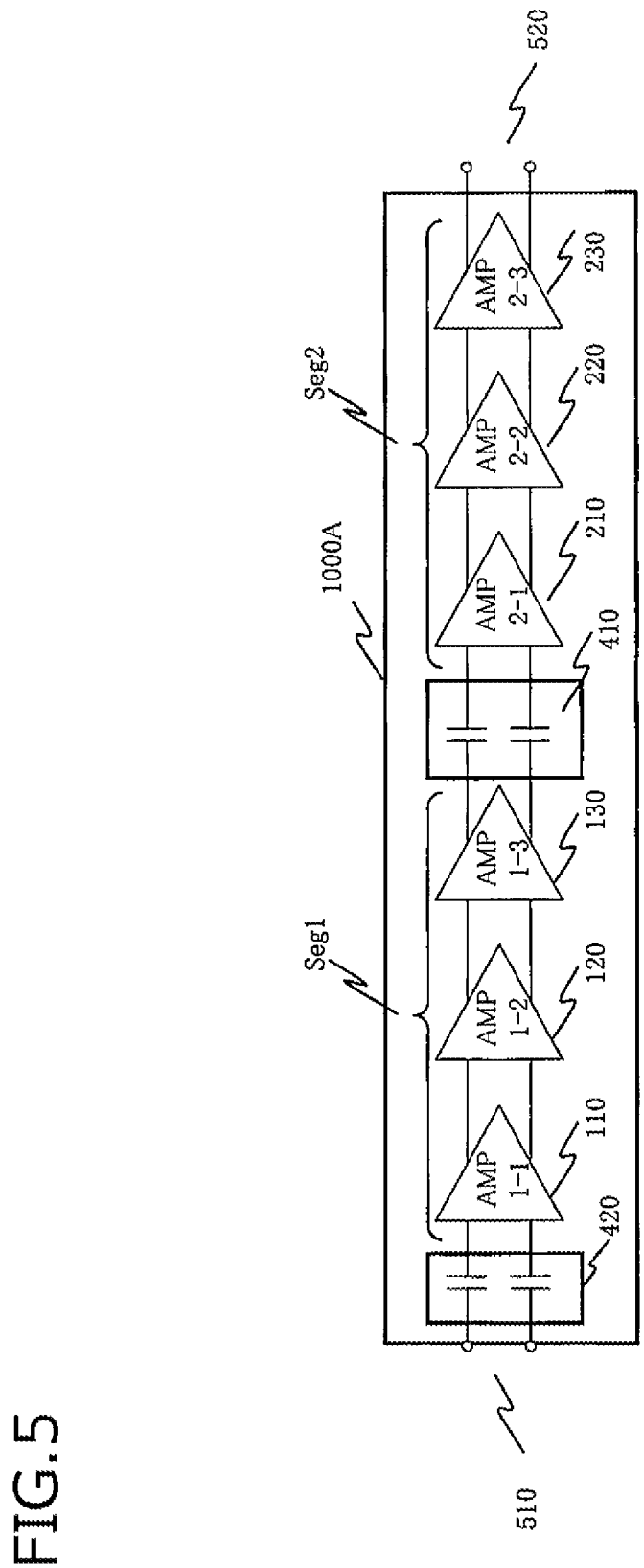
FIG. 5 is a circuit diagram illustrating Modification 1 of the circuit configuration of the multistage amplifier in the first embodiment.

As illustrated in FIG. 5, the multistage amplifier 1000 may be a multistage amplifier 1000A in which an HPF 420 is inserted between the input terminal 510 and the differential amplifier 110 of the (1-1)-th stage. Thus, the DC offset from the preceding stage of the multistage amplifier 1000 can be suppressed. For example, when the multistage amplifier 1000 is mounted in the receiver, the preceding stage of the multistage amplifier 1000 is, for example, a low noise amplifier (LNA) or a mixer.

(Modification 2)

Figure 6:
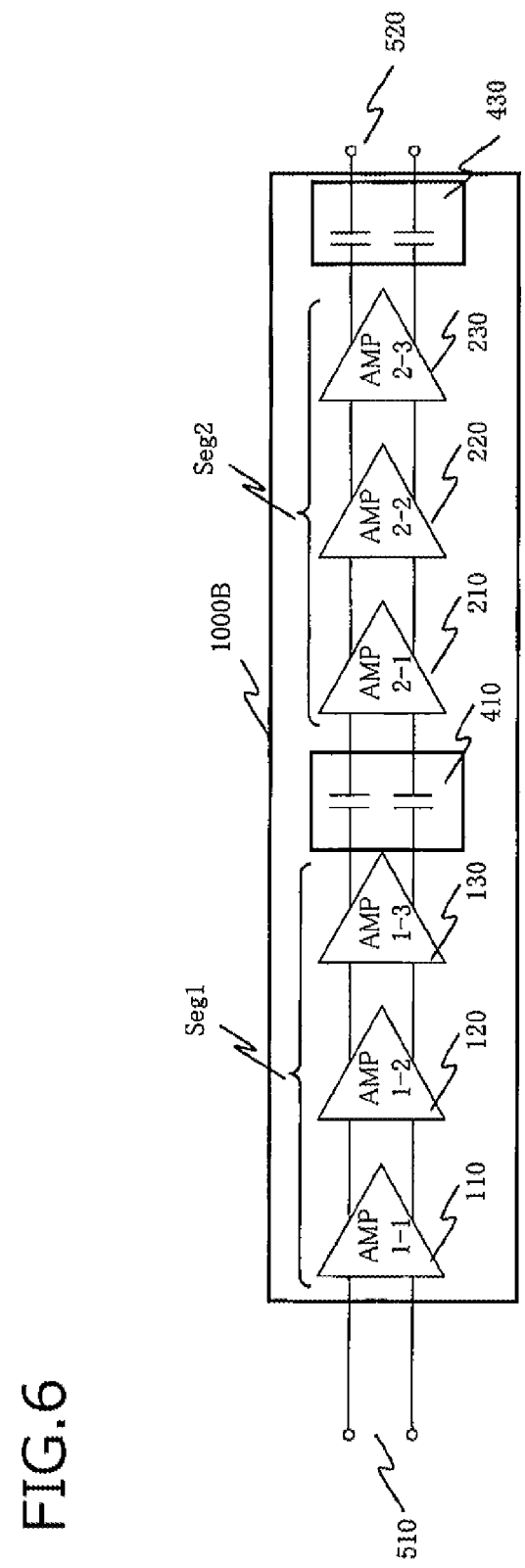
FIG. 6 is a circuit diagram illustrating Modification 2 of the circuit configuration of the multistage amplifier in the first embodiment.

As illustrated in FIG. 6, the multistage amplifier 1000 may be a multistage amplifier 1000B in which an HPF 430 is inserted between the differential amplifier 230 of the (2-3)-th stage and the output terminal 520. Thus, the DC offset to be outputted to the subsequent stage of the multistage amplifier 1000 can be suppressed. For example, when the multistage amplifier 1000 is mounted in the receiver, the subsequent stage of the multistage amplifier 1000 is, for example, an analog to digital converter (ADC) or a digital circuit.

(Modification 3)

Further, suppressing the DC offset by the HPF 410 has been exemplified, but the DC offset may be suppressed by other methods. For example, the differential output of one of the differential amplifiers 100 is branched for detecting the DC offset, and only a DC component is extracted by a low pass filter (LPF). Further, the parameters (for example, a resistance value) of the differential amplifier 100 or the preceding stage differential amplifier 100 of the differential amplifier 100 may be adjusted and the DC offset may be cancelled.

In addition, Modifications 1 to 3 may be combined as appropriate.

Second Embodiment

Figure 7:
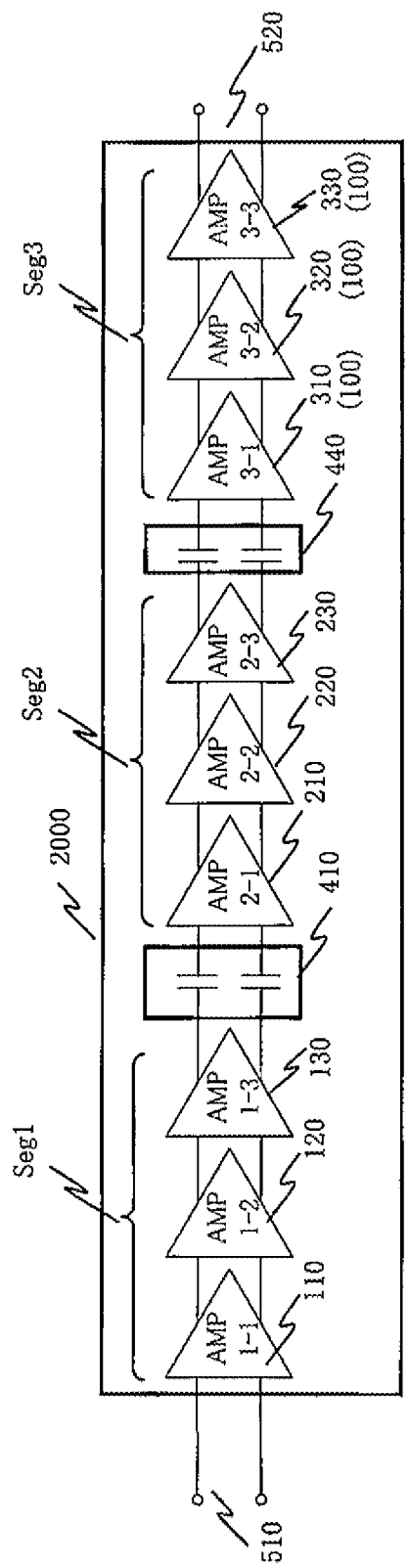
FIG. 7 is a circuit diagram illustrating a circuit configuration example of a multistage amplifier in a second embodiment.

FIG. 7 is a circuit diagram illustrating a circuit configuration example of a multistage amplifier 2000 in a second embodiment. The configuration and operation of the multistage amplifier 2000 are the same as the configuration and operation of the multistage amplifier 1000 described in the first embodiment. In FIG. 7, the same components as those of the multistage amplifier 1000 in FIG. 1 are denoted by the same reference numerals and signs, and thus the description thereof will be omitted or simplified. In addition, the multistage amplifier 2000 may have the same configuration as that of the multistage amplifier 1000A or 1000B, or the combination described in the first embodiment.

The multistage amplifier 2000 includes, for example, an HPF 440 and a third segment Seg3 in addition to the configuration of the multistage amplifier 1000. The third segment Seg3 includes a differential amplifier 310 of the (3-1)-th stage, a differential amplifier 320 of the (3-2)-th stage, and a differential amplifier 330 of the (3-3)-th stage.

Differential baseband signals which are inputted from the input terminal 510 are outputted to the HPF 440 through each differential amplifier 100 of the first segment Seg1, the HPF 410, and each differential amplifier 100 of the second segment Seg2. In addition, differential baseband signals which have been output from the HPF 440 are outputted from the output terminal 520, through each differential amplifier 100 of the third segment Seg3. In the third segment Seg3, signals are transmitted in the order of the differential amplifier 310 of the (3-1)-th stage, the differential amplifier 320 of the (3-2)-th stage, and the differential amplifier 330 of the (3-3)-th stage.

Next, a description will be made regarding a setting example of the transistor size S of the transistor included in the differential amplifier 100.

When the transistor size S of the differential amplifier 100 of the (X-Y)-th stage is set to $S_{X-Y}$, the transistor size is designed to satisfy the following equation (2), in the multistage amplifier 2000.

$$S_{1-1} \geq S_{1-2}$$

$$S_{2-1} \geq S_{2-2}$$

$$S_{3-1} \geq S_{3-2}$$

$$S_{2-1} \geq S_{1-2}$$

$$S_{3-1} \geq S_{2-2} \qquad \text{Equations (2)}$$

In other words, in each segment, the transistor size of the differential amplifier 100 is designed by the Inverse Scaling. In Equation 2, $S_{3-1} \geq S_{3-2}$ and $S_{3-1} \geq S_{2-2}$ are added to Equation 1.

By setting $S_{3-1} \geq S_{3-2}$, similar to $S_{1-1} \geq S_{1-2}$, the variation of the DC offset generated in the differential amplifier 310 of the (3-1)-th stage is reduced further than the variation of the DC offset of the differential amplifier 320 of the (3-2)-th stage having a relatively small influence. Since the DC offset of the differential amplifier 310 of the (3-1)-th stage is also amplified even in the differential amplifier 320 to which signals are relayed, the influence to the variation of the DC offset that are inputted to the differential amplifier 330 of the (3-3)-th stage is greater than that of the differential amplifier 320 of the (3-2)-th stage.

Therefore, since the transistor size of the differential amplifier 100 in each stage gradually decreases in the third segment Seg3, it is possible to suppress an increase in the transistor size and an increase in the parasitic capacitance. Further, it is possible to efficiently reduce the DC offset that is inputted to the differential amplifier 330 of the (3-3)-th stage.

Further, the transistor size of the differential amplifiers 310 and 320 of the subsequent stages can be designed to be greater than the HPF 440 which has been designed to be significantly small in a case of applying the Inverse Scaling in the related art, by setting $S_{3-1} \geq S_{2-2}$. Thus, it is possible to reduce the variation of the DC offset that is inputted to the differential amplifier 330 of the (3-3)-th stage.

In this manner, since it is possible to reduce the variation of the DC offsets that are inputted to the differential amplifiers 130, 230, and 330 of the last stages in the respective segments, it is possible to suppress a decrease in the gain of the multistage amplifier 2000.

Further, in the present embodiment, an example in which there are two HPFs between respective segments has been exemplified, but the present disclosure is not limited to this. For example, an HPF and differential amplifiers in a fourth segment may be added, and many HPFs and differential amplifiers may be added.

Third Embodiment

Figure 8:
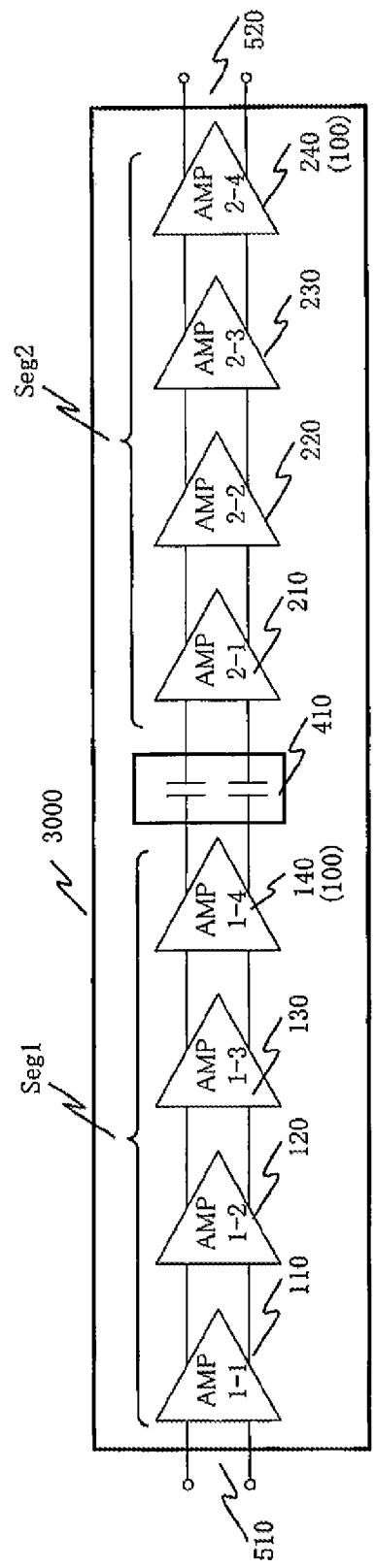
FIG. 8 is a circuit diagram illustrating a circuit configuration example of a multistage amplifier in a third embodiment.

FIG. 8 is a circuit diagram illustrating a circuit configuration example of a multistage amplifier 3000 in a third embodiment. The configuration and operation of the multistage amplifier 3000 are the same as the configuration and operation of the multistage amplifier 1000 described in the first embodiment. In FIG. 8, the same components as those of multistage amplifier 1000 in FIG. 1 are denoted by the same reference numerals and signs, and thus the description thereof will be omitted or simplified. In addition, the multistage amplifier 3000 may have the same configuration as that of the multistage amplifier 1000A or 1000B, or the combination described in the first embodiment.

The multistage amplifier 3000 is different from the multistage amplifier 1000 in the number of differential amplifiers 100 disposed in each segment. The multistage amplifier 3000 includes a differential amplifier 140 of the (1-4)-th stage and a differential amplifier 240 of the (2-4)-th stage, in addition to the configuration of the multistage amplifier 1000.

Differential baseband signals which are inputted from the input terminal 510 are outputted to the HPF 410 through the differential amplifier 110 of the (1-1)-th stage, the differential amplifier 120 of the (1-2)-th stage, the differential amplifier 130 of the (1-3)-th stage, and the differential amplifier 140 of the (1-4)-th stage. In addition, differential baseband signals which have been output from the HPF 410 are outputted from the output terminal 520, through the differential amplifier 210 of the (2-1)-th stage, the differential amplifier 220 of the (2-2)-th stage, the differential amplifier 230 of the (2-3)-th stage, and the differential amplifier 240 of the (2-4)-th stage.

Next, a description will be made regarding a setting example of the transistor size S of the transistor included in the differential amplifier 100.

When the transistor size S of the differential amplifier 100 of the (X-Y)-th stage is set to $S_{X-Y}$, the transistor size is designed to satisfy the following equation (3), in the multistage amplifier 3000.

$$S_{1-1} \geq S_{1-2} \geq S_{1-3}$$

$$S_{2-1} \geq S_{2-2} \geq S_{2-3}$$

$$S_{2-1} \geq S_{1-3} \qquad \text{(Equation 3)}$$

In other words, in each segment, the transistor size of the differential amplifier 100 is designed by the Inverse Scaling.

By setting $S_{1-1} \geq S_{1-2} \geq S_{1-3}$, the variation of the DC offset generated in the differential amplifier 110 of the (1-1)-th stage is reduced further than the variation of the DC offset of the differential amplifier 120 of the (1-2)-th stage having an influence smaller than that of the differential amplifier 110. Further, the variation of the DC offset generated in the differential amplifier 120 of the (1-2)-th stage is reduced further than the variation of the DC offset of the differential amplifier 130 of the (1-3)-th stage having an influence smaller than that of the differential amplifier 120.

Since the DC offset of the differential amplifier 110 of the (1-1)-th stage is also amplified even in the differential amplifier 120 to which signals are relayed, the influence to the variation of the DC offset that are inputted to the differential amplifier 140 of the (1-4)-th stage is greater than that of the differential amplifier 120 of the (1-2)-th stage. Further, since the DC offset of the differential amplifier 110 of the (1-2)-th stage is also amplified even in the differential amplifier 130 to which signals are relayed, the influence to the variation of the DC offset that is inputted to the differential amplifier 140 of the (1-4)-th stage is greater than that of the differential amplifier 130 of the (1-3)-th stage.

Therefore, since the transistor size of the differential amplifier 100 in each stage gradually decreases in the first segment Seg1, it is possible to suppress an increase in the transistor size and an increase in the parasitic capacitance. Further, it is possible to efficiently reduce the DC offset that is inputted to the differential amplifier 140 of the (1-4)-th stage.

Similarly, since the transistor size of the differential amplifier 100 in each stage gradually decreases in the second segment Seg2 by setting $S_{2-1} \geq S_{2-2} \geq S_{2-3}$, it is possible to suppress an increase in the transistor size and an increase in the parasitic capacitance. Further, it is possible to efficiently reduce the DC offset that is inputted to the differential amplifier 240 of the (2-4)-th stage.

Further, the transistor sizes of the differential amplifiers 210, 220, and 230 of the subsequent stages can be designed to be greater than the HPF 410 which has been designed to be significantly small in a case of applying the Inverse Scaling in the related art, by setting $S_{2-1} \geq S_{1-3}$. Thus, it is possible to reduce the variation of the DC offset that is inputted to the differential amplifier 240 of the (2-4)-th stage.

Further, in the present embodiment, an example has been exemplified in which the number of HPFs is one and the number of stages of the differential amplifier is eight in total. In addition thereto, for example, an HPF is present between one or more stages, and differential amplifiers of three stages or more may be present in at least two positions (two segments) among between the input terminal 510 and the HPF, between a plurality of HPFs, and between the HPF and the output terminal 520. Even in this case, the effect of the present embodiment is achieved, and thus it is possible to achieve both utilizing in the broad bandwidth and suppressing gain reduction of the multistage amplifier 4000.

Fourth Embodiment

Figure 9:
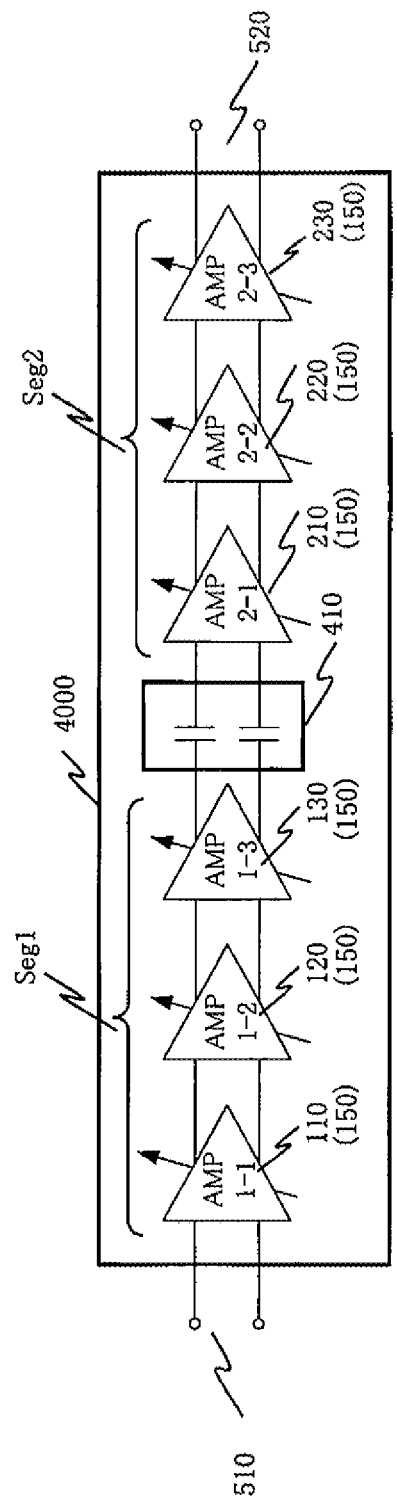
FIG. 9 is a circuit diagram illustrating a circuit configuration example of a multistage amplifier in a fourth embodiment.

FIG. 9 is a circuit diagram illustrating a circuit configuration example of a multistage amplifier 4000 in a fourth embodiment. The configuration and operation of the multistage amplifier 4000 are the same as the configuration and operation of the multistage amplifier 1000 described in the first embodiment. In FIG. 9, the same components as those of the multistage amplifier 1000 in FIG. 1 are denoted by the same reference numerals and signs, and thus the description thereof will be omitted or simplified. In addition, the multistage amplifier 4000 may have the same configuration as that of the multistage amplifier 1000A or 1000B, or the combination described in the first embodiment.

The multistage amplifier 4000 is different from the multistage amplifier 1000 illustrated in FIG. 1 in that the differential amplifier 100 in each stage is a variable gain amplifier (VGA) 150.

Since each differential amplifier 100 is the variable gain amplifier 150, it is possible to change the gain of the multistage amplifier 4000. Thus, a desired gain can be adjusted, and it is possible to achieve both utilizing in a broad bandwidth and suppressing gain reduction.

The gain reduction due to the variation of the DC offset in the multistage amplifier 4000 is maximized when the gain of the variable gain amplifier 150 is set to a maximum value. When a setting of the gain of the multistage amplifier 4000 is fixed to, for example, a maximum value, the multistage amplifier 4000 operates similarly to the multistage amplifier 1000 in the first embodiment. For example, since the gain of the multistage amplifier 4000 is fixed to the maximum value and the differential amplifier 100 included in the multistage amplifier 4000 is set to the transistor size based on (Equation 1), the same effect as FIG. 3 described in the first embodiment is obtained.

In addition, in FIG. 9, although the example is illustrated in which the differential amplifiers 100 of all stages in the multistage amplifier 4000 are variable gain amplifiers 150, it is not limited thereto. For example, even when a portion of the differential amplifiers 100 are the variable gain amplifiers 150 and the remaining differential amplifiers 100 are gain-fixed differential amplifiers 100, the same effect can be obtained.

Fifth Embodiment

Figure 10:
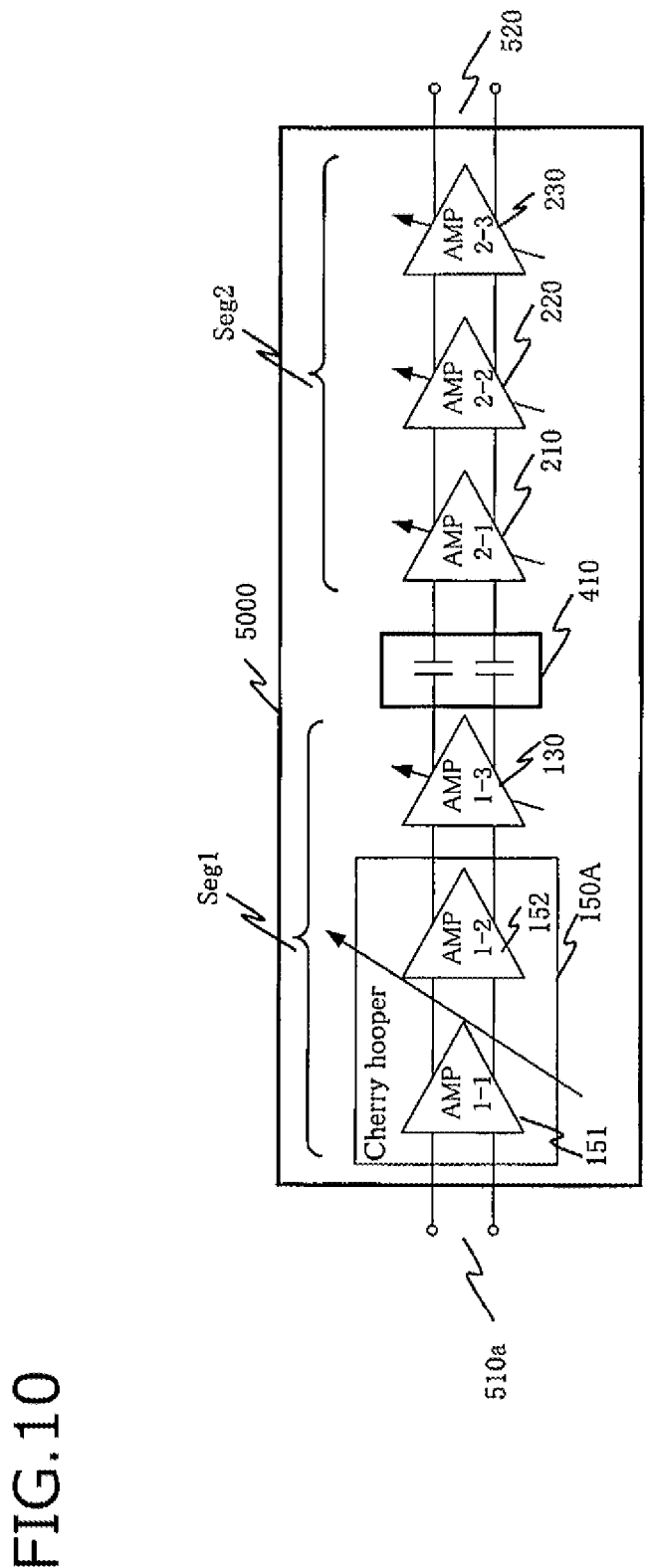
FIG. 10 is a circuit diagram illustrating a circuit configuration example of a multistage amplifier in a fifth embodiment.

FIG. 10 is a circuit diagram illustrating a circuit configuration example of a multistage amplifier 5000 in a fifth embodiment. The multistage amplifier 5000 is different from the multistage amplifier 4000 in the fourth embodiment in that the differential amplifiers 100 of the stages of a portion are a variable gain amplifier of type Cherry-Hooper 150A.

Figure 11:
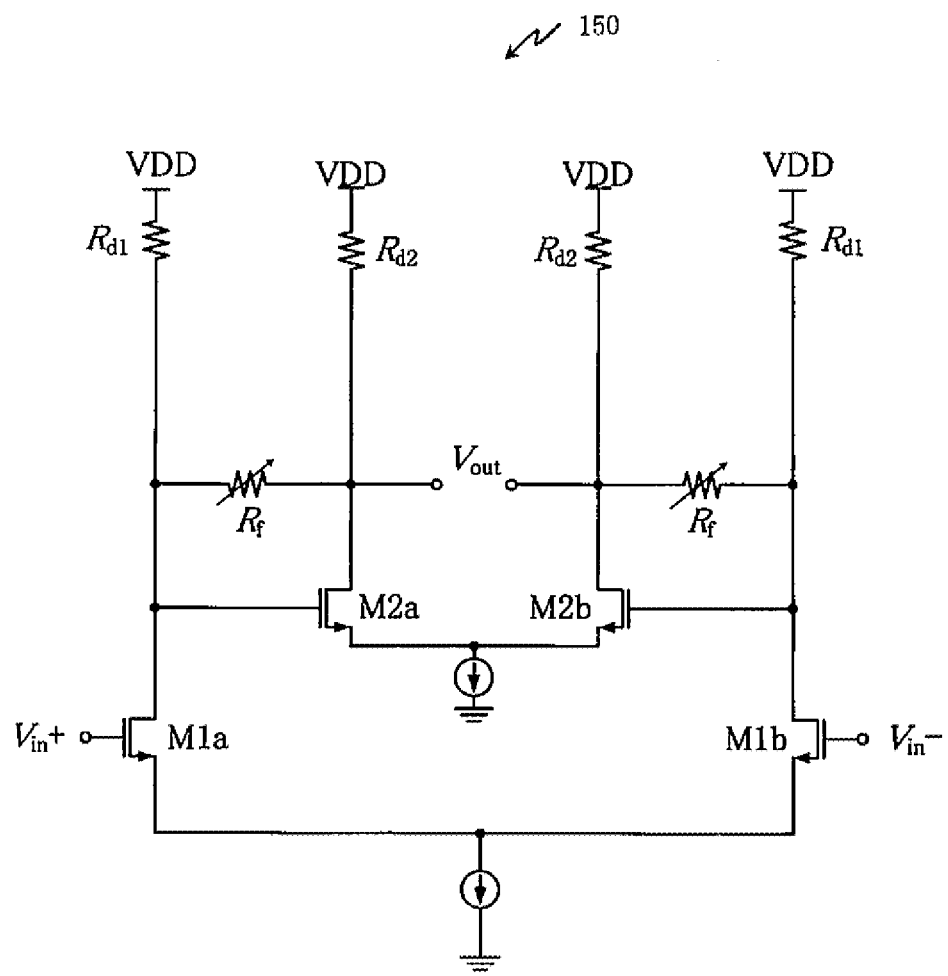
FIG. 11 is a circuit diagram illustrating a circuit configuration example of a transistor level of a variable gain amplifier of type Cherry-Hooper in the fifth embodiment.

FIG. 11 is a circuit diagram illustrating a circuit configuration example of a transistor level of the variable gain amplifier of type Cherry-Hooper 150A. The variable gain amplifier of type Cherry-Hooper 150A includes differential amplifiers 151 of a first stage including input terminals M1a and M1b, differential amplifiers 152 of a second stage including input terminals M2a and M2b, and a feedback resistor $R_f$. In other words, the variable gain amplifier of type Cherry-Hooper 150A includes the differential amplifiers 151 and 152 of two stages, and controls the gain of the feedback resistor $R_f$.

The operation and effect of the multistage amplifier 5000 is the same as that of the multistage amplifier 4000, and thus a description thereof will be omitted.

Sixth Embodiment

Figure 12:
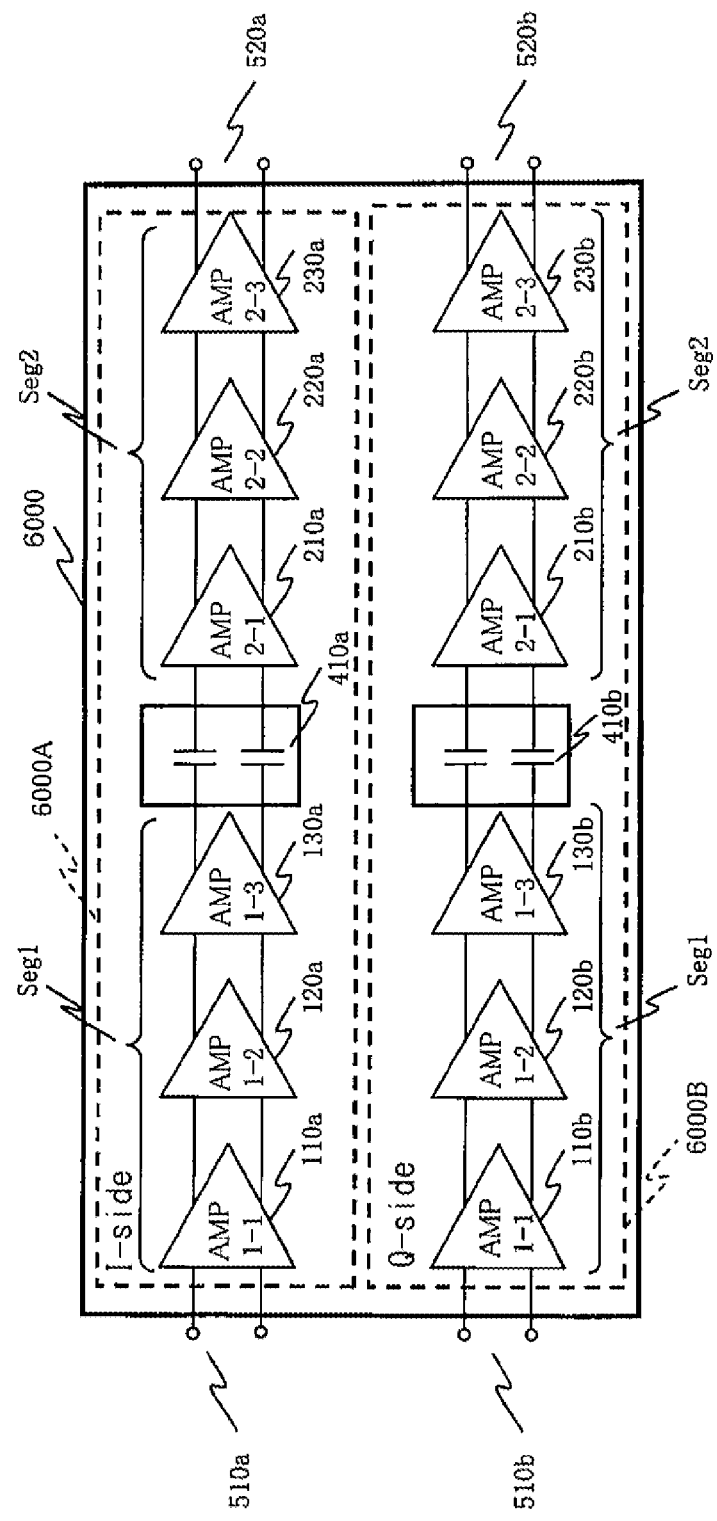
FIG. 12 is a circuit diagram illustrating a circuit configuration example of a multistage amplifier of a sixth embodiment.

FIG. 12 is a circuit diagram illustrating a circuit configuration example of a multistage amplifier 6000 in a sixth embodiment. The multistage amplifier 6000 includes an I-side multistage amplifier 6000A that processes I signals out of IQ signals, and Q-side multistage amplifier 6000B that processes Q signals.

The configuration and operation of the I-side multistage amplifier 6000A and the Q-side multistage amplifier 6000B are the same as the configuration and operation of any of the multistage amplifiers in any of the first to fifth embodiments, thus the detailed description thereof will be omitted or simplified. It is exemplified that the present embodiment is the same as the multistage amplifier 1000 of the first embodiment in the configuration and operation.

In the I-side multistage amplifier 6000A and the Q-side multistage amplifier 6000B of FIG. 12, some reference numerals are changed from the multistage amplifier 1000 of FIG. 1. For example, "a" and "b" are respectively added to the I-side and the Q-side.

The I-side multistage amplifier 6000A includes an input terminal 510a and an output terminal 520a. Further, the I-side multistage amplifier 6000A includes a differential amplifier 110a of the (1-1)-th stage, a differential amplifier 120a of the (1-2)-th stage, and a differential amplifier 130a of the (1-3)-th stage. Further, the I-side multistage amplifier 6000A includes a differential amplifier 210a of the (2-1)-th stage, a differential amplifier 220a of the (2-2)-th stage, and a differential amplifier 230a of the (2-3)-th stage. Further, the I-side multistage amplifier 6000A includes an HPF 410a. The I-side multistage amplifier 6000A amplifies the I-side signals (I signals) of differential baseband signals.

The Q-side multistage amplifier 6000B includes an input terminal Slob and an output terminal 520b. Further, the Q-side multistage amplifier 6000B includes a differential amplifier 110b of the (1-1)-th stage, a differential amplifier 120b of the (1-2)-th stage, and a differential amplifier 130b of the (1-3)-th stage. Further, the Q-side multistage amplifier 6000B includes a differential amplifier 210b of the (2-1)-th stage, a differential amplifier 220b of the (2-2)-th stage, and a differential amplifier 230b of the (2-3)-th stage. Further, the Q-side multistage amplifier 6000B includes an HPF 410b. The Q-side multistage amplifier 6000B amplifies the Q-side signals (Q signals) of differential baseband signals.

Next, a description will be made regarding the transistor size S, the variation of the DC offset, and an IQ amplitude error worst value of the multistage amplifier 6000 in the present embodiment and the related art.

Figure 13:
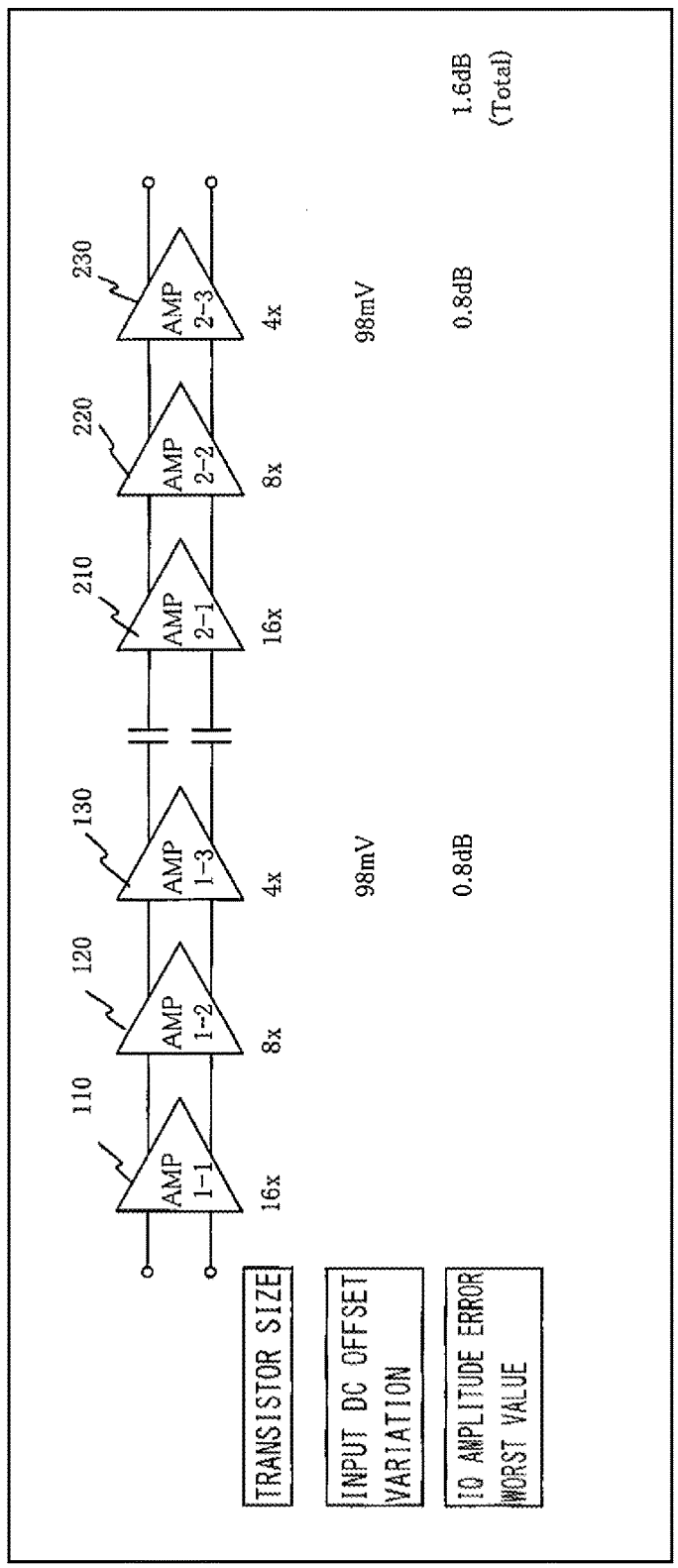
FIG. 13 is a schematic diagram illustrating examples of a transistor size, a variation of a DC offset, and an IQ (In-phase Quadrature-Phase) amplitude error worst value of the multistage amplifier in the sixth embodiment.
Figure 14:
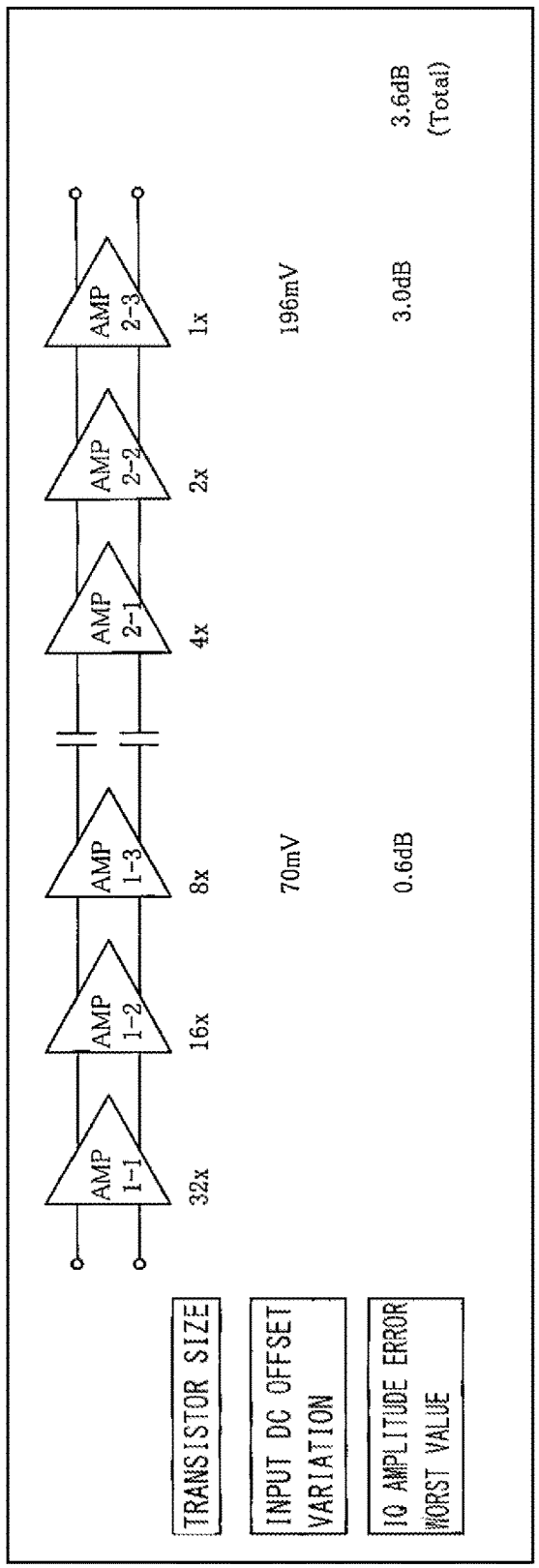
FIG. 14 is a schematic diagram illustrating examples of a transistor size, a variation of a DC offset, and an IQ amplitude error worst value of a multistage amplifier of the related art when a circuit is configured similar to the multistage amplifier of the sixth embodiment.

FIG. 13 is a schematic diagram illustrating the transistor size S, the variation of the DC offset, and the IQ amplitude error worst value of the multistage amplifier 6000 in the present embodiment. FIG. 14 is a schematic diagram illustrating the transistor size S, the variation of the DC offset, and the IQ amplitude error worst value of the multistage amplifier in the related art. FIGS. 13 and 14 are diagrams illustrating examples of simulation results.

Here, the transistor sizes are set in such a manner that the bandwidths in consideration of the parasitic capacitances of the transistors in each differential amplifier 100 are the same in the present embodiment and the related art. Further, the parasitic capacitance of the drain terminal of the transistor per one transistor in each differential amplifier 100 is assumed as 0.7 fF, and the parasitic capacitance of the gate terminal is assumed as 1.4 fF.

In the multistage amplifier 6000 of FIG. 13, even in each segment of either the I-side multistage amplifier 6000A or the Q-side multistage amplifier 6000B, the transistor size of the differential amplifier 100 is designed by the Inverse Scaling.

In the multistage amplifier 6000 of FIG. 14, even in either the I-side multistage amplifier 6000A or the Q-side multistage amplifier 6000B, the transistor size of the differential amplifier 100, from the input terminal to the output terminal of the multistage amplifier, is designed by the Inverse Scaling.

In the simulation, the input of the differential amplifier of the last stage in each segment (for example, the differential amplifiers 130a and 130b of the (1-3)-th stage, and the differential amplifiers 230a and 230b of the (2-3)-th stage) is performed using a test device which is not illustrated.

The test device measures, for example, the DC offset characteristics of a plurality of samples (the IC of a plurality of the I-side multistage amplifier 6000A and the IC of a plurality of the Q-side multistage amplifier 6000B). Then, the test device derives a difference between a maximum value (for example, +3σ value) and a minimum value (for example, −3σ value) of the DC offset of each measured result, as the variation of the DC offset.

Further, a plurality of sample signals are inputted to the I-side multistage amplifier 6000A, and the I signals of sample signals are sequentially measured. The measured I signals are signals which are inputted to the differential amplifier of the last stage in each segment, or output from the differential amplifier.

Similarly, a plurality of sample signals are inputted to the Q-side multistage amplifier 6000B, and the Q signals of sample signals are sequentially measured. The measured Q signals are signals which are inputted to the differential amplifier of the last stage in each segment, or output from the differential amplifier.

The difference between the amplitudes of the measured I signals and Q signals are derived as an IQ amplitude error (IQ imbalance). Further, the maximum value of the IQ amplitude error among a plurality of IQ amplitude errors as the simulation result is derived as the IQ amplitude error worst value. In addition, the IQ amplitude error is a difference due to dbm of, for example, the I signals and the Q signals.

The transistor size and the variation of DC offset are the same as in the first embodiment.

The IQ amplitude error worst values are compared. The IQ amplitude error worst values of the differential amplifier of the (1-3)-th stage are 0.8 dB in the present embodiment and 0.6 dB in the related art method. The IQ amplitude error worst values of the differential amplifier of the (2-3)-th stage are 0.8 dB in the present embodiment and 3.0 dB in the related art method.

Since the IQ amplitude error worst value of the entire multistage amplifier is a total value of the IQ amplitude error worst values of the differential amplifier of the last stage in each segment, it is 1.6 dB in the present embodiment and 3.6 dB in the related art method. In other words, the IQ amplitude error worst value of the present embodiment is 2 dB smaller than that in the related art.

Figure 15:
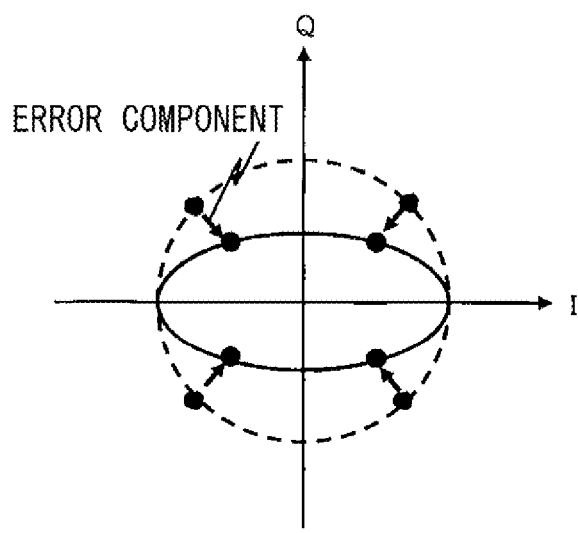
FIG. 15 is a schematic diagram illustrating an example of misalignment of IQ signals.

Thus, according to the multistage amplifier 6000, it is possible to reduce the IQ amplitude error, in addition to the effects described in the first to fifth embodiments. Further, the IQ amplitude error can be reduced, as illustrated in FIG. 15, and it is possible to prevent the signal point from being shifted from a desired position due to the error component, and suppress the deterioration of the bit error rate. Therefore, it is possible to achieve both an utilization of the multistage amplifier 6000 in a broad bandwidth and reduction in the IQ amplitude error.

In addition, when the differential amplifier 100 is the variable gain amplifier 150, the deterioration of the IQ amplitude error due to the variation of the DC offset is maximized when the gain of the variable gain amplifier 150 is set to a maximum value. When the setting of the gain of the multistage amplifier 6000 is fixed to, for example, the maximum value, similar to FIG. 13, the variation of the DC offset is the IQ amplitude error worst value.

(Overview of an Aspect of the Present Disclosure)

A first multistage amplifier of the present disclosure includes a plurality of differential amplifiers which are connected in series; and a direct-current component limiter that cuts off a direct-current component of input signals, in which the direct-current component limiter is disposed between the plurality of differential amplifiers, and in which a transistor size of a first differential amplifier which is disposed immediately after the direct-current component limiter is equal to or greater than a transistor size of a second differential amplifier which is disposed two stages before the direct-current component limiter.

Further, a second multistage amplifier of the present disclosure is the first multistage amplifier, in which in a segment indicating a range between the direct-current component limiter, and one of an input terminal of the multistage amplifier, another direct-current component limiter, and an output terminal of the multistage amplifier, a transistor size of a predetermined differential amplifier is equal to or greater than the transistor size of a differential amplifier which is disposed immediately after the predetermined differential amplifier.

Further, a third multistage amplifier of the present disclosure is the second multistage amplifier, in which the predetermined differential amplifier is a differential amplifier which is disposed in any stage from a first stage to a stage excluding last two stages in the segment.

Further, a fourth multistage amplifier of the present disclosure is any of the first to third multistage amplifiers, in which when a range between the direct-current component limiter, and one of an input terminal of the multistage amplifier, another direct-current component limiter, and an output terminal of the multistage amplifier is assumed as a segment, at least three differential amplifiers are disposed in each of at least two segments.

Further, a fifth multistage amplifier of the present disclosure is any of the first to fourth multistage amplifiers, in which the direct-current component limiter is included in a plurality of direct-current component limiters, and in which a first direct-current component limiter is disposed immediately after an input terminal of the multistage amplifier.

Further, a sixth multistage amplifier of the present disclosure is any of the first to fifth multistage amplifiers, in which the direct-current component limiter is included in a plurality of direct-current component limiters, and in which a second direct-current component limiter is disposed immediately before an output terminal of the multistage amplifier.

Further, the seventh multistage amplifier of the present disclosure is any of the first to sixth multistage amplifiers, in which the direct-current component limiter includes a high pass filter (HPF).

Further, the eighth multistage amplifier of the present disclosure is any of the first to seventh multistage amplifiers, in which the differential amplifier includes a variable gain amplifier.

Further, the ninth multistage amplifier of the present disclosure is the eighth multistage amplifier, in which the differential amplifier includes a variable gain amplifier of type Cherry-Hooper, and in which the variable gain amplifier of type Cherry-Hooper includes two differential amplifiers.

Further, a tenth multistage amplifier of the present disclosure is any of the first to ninth multistage amplifiers, in which there are a plurality of the multistage amplifiers, in which a first multistage amplifier amplifies I signals, and in which a second multistage amplifier amplifies Q signals.

Hitherto, although various embodiments have been described with reference to the accompanying drawings, it is needless to say that the present disclosure is not limited to such examples. It is obvious that a person skilled in the art may conceive various changes and modifications within the scope set forth in the appended claims, and the changes and modifications are of course understood to belong to the technical scope of the present disclosure.

The present disclosure is based on Japanese Patent Application No. 2013-022562 filed Feb. 7, 2013, and the contents of which are incorporated herein by reference.

INDUSTRIAL APPLICABILITY

The present disclosure is useful for the multistage amplifier that can achieve both utilizing in a broad bandwidth and suppressing gain reduction. For example, the present disclosure is useful as a baseband signal differential amplifier in a wireless communication device.

REFERENCE SIGNS LIST 100, 110a, 110b, 120, 120a, 120b, 130, 130a, 130b, 140, 210, 210a, 210b, 220, 220a, 220b, 230, 230a, 230b, 240, 310, 320, 330: DIFFERENTIAL AMPLIFIER
150: VARIABLE GAIN AMPLIFIER
150A: VARIABLE GAIN AMPLIFIER OF TYPE CHERRY-HOOPER
410, 410a, 410b, 420, 430, 440: HPF
510, 510a, 510b: INPUT TERMINAL
520, 520a, 520b: OUTPUT TERMINAL
1000, 1000A, 1000B, 2000, 3000, 4000, 5000, 6000: MULTISTAGE AMPLIFIER
6000A: I-SIDE MULTISTAGE AMPLIFIER
6000B: Q-SIDE MULTISTAGE AMPLIFIER
Seg1: FIRST SEGMENT
Seg2: SECOND SEGMENT
Seg3: THIRD SEGMENT

The invention claimed is:

1. A multistage amplifier comprising:
a plurality of differential amplifiers which are connected in series and are divided to a plurality of segments; and
a first direct-current component limiter that cuts off a direct-current component of input signals and is disposed between the plurality of segments,
wherein a transistor size of a first differential amplifier which is disposed immediately after the first direct-current component limiter is greater than a transistor size of a second differential amplifier which is disposed two stages before the first direct-current component limiter, and
wherein a transistor size of a predetermined differential amplifier in a plurality of differential amplifiers included in each of the segments is greater than a transistor size of a differential amplifier disposed in a subsequent stage of the predetermined differential amplifier.

2. The multistage amplifier according to claim 1, wherein the predetermined differential amplifier is a differential amplifier which is disposed in any stage from a first stage to a stage excluding last two stages in the segment.

3. The multistage amplifier according to claim 1,
wherein the plurality of differential amplifiers are divided to at least two segments, and
wherein each of the at least two segments includes at least three differential amplifiers.

4. The multistage amplifier according to claim 1, further comprising, a second direct-current component limiter is disposed immediately after an input terminal of the multistage amplifier.

5. The multistage amplifier according to claim 1, further comprising,
a third direct-current component limiter is disposed immediately before an output terminal of the multistage amplifier.

6. The multistage amplifier according to claim 1, wherein the first direct-current component limiter includes a high pass filter (HPF).

7. The multistage amplifier according to claim 1, wherein the differential amplifier includes a variable gain amplifier.

8. The multistage amplifier according to claim 7,
wherein the differential amplifier includes a variable gain amplifier of type Cherry-Hooper, and
wherein the variable gain amplifier of type Cherry-Hooper includes two differential amplifiers.

9. The multistage amplifier according to claim 1,
wherein there are a plurality of the multistage amplifiers,
wherein a first multistage amplifier amplifies I signals, and
wherein a second multistage amplifier amplifies Q signals.

10. The multistage amplifier according to claim 1, wherein no direct-current component limiter is disposed between the second differential amplifier and a third differential amplifier, the third differential amplifier being disposed immediately before the first direct-current component limiter.

11. The multistage amplifier according to claim 10,
wherein no direct-current component limiter is disposed between the plurality of differential amplifiers in each of the plurality of segments.

* * * * *